United States Patent [19]

Gass et al.

[11] 4,019,877
[45] Apr. 26, 1977

[54] METHOD FOR COATING OF POLYIMIDE BY ELECTRODEPOSITION

[75] Inventors: William R. Gass, Pittsburgh; Luciano C. Scala, Murrysville; David C. Phillips, Penn Hills Township, Allegheny County, all of Pa.

[73] Assignee: Westinghouse Electric Corporation, Pittsburgh, Pa.

[22] Filed: Oct. 21, 1975

[21] Appl. No.: 624,352

[52] U.S. Cl. .......................... 428/626; 204/129.75; 204/181; 428/675
[51] Int. Cl.² .................... C25D 13/06; B23P 3/00
[58] Field of Search ............. 204/181, 141.5, 32 R, 204/37 R, 129.75; 29/195 P

[56] References Cited

UNITED STATES PATENTS

| 2,725,353 | 11/1955 | Strobel | 204/32 R |
| 2,753,301 | 7/1956 | Bersworth et al. | 204/32 R |
| 3,547,788 | 12/1970 | Tanaka et al. | 204/181 X |
| 3,846,269 | 11/1974 | Martello et al. | 204/181 |

OTHER PUBLICATIONS

A. Kenneth Graham, "Electroplating Engineering Handbook", 2nd edition, p. 197, (1962).
Frederick A. Lowenheim, "Modern Electroplating", pp. 261–262, (1963).

*Primary Examiner*—G. L. Kaplan
*Attorney, Agent, or Firm*—D. P. Cillo

[57] ABSTRACT

A method of coating a copper substrate comprises the steps of: anodically microsmoothing the copper substrate in an acid bath to provide a substantially smooth surface; electrocoating the microsmoothed substrate with a pin hole free nickel film having a thickness of between about 2.5 microns to about 12.5 microns; single step, non-aqueous electrocoating the microsmoothed, nickel coated substrate with a pin hole free polyamic acid polymer, and curing the polyamic acid coating to form a polyimide film free of copper ion contamination.

14 Claims, 1 Drawing Figure

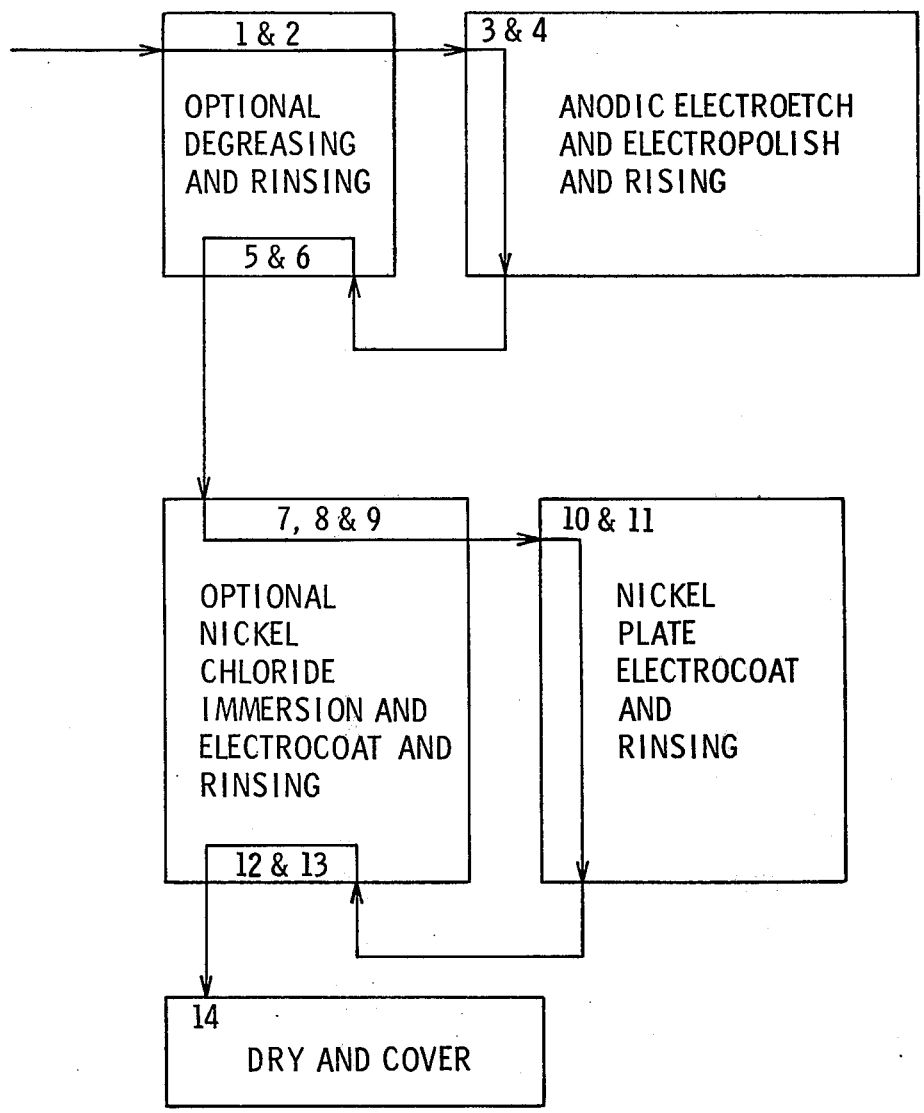

METHOD FOR COATING OF POLYIMIDE BY ELECTRODEPOSITION

BACKGROUND OF THE INVENTION

The electrodeposition of various polyamic acids onto a metal substrate, followed by a heat cure, has resulted in successful polyimide film coatings on many types of electrical conductors, as taught by Martello et al, in U.S. Pat. No. 3,846,269.

It has been found, however, that the polyamic acid polymer does not electrodeposit as uniformly as might be expected on a non-polished, bare copper substrate. Also, the technique for electrodepositing polyamic acid polymer films is anodic, and the film coatings appear to accumulate soluble copper, possibly as the result of diffusion of copper ions into the resin layer during the electrodeposition process. Partly cured resin films show some green color due to such copper inclusions. Full cure to the polyimide requires temperatures of about 275° C or higher. When the resin is cured to this temperature, such copper containing polyimide insulation tends to lose some extensibility and adhesion and the insulation may crack when wound around relatively small bends. It is thought that the copper inclusions are directly responsible for these results.

Tanaka, in U.S. Pat. No. 3,547,788, recognized this problem of copper diffusion when electrocoating an aqueous solution of water soluble resins in ammonium salt form. He first washed the bare copper conductor, and then electrocoated with nickel in an aqueous nickel sulfate bath to a thickness of between 0.5 to 1 micron. After this, he electrophoretically coated the substrate with an ammonia or an amine salt of an electrolytic resin. The resulting solution was not a film but a porous precipitation layer of accumulated resin particles. This coating was not pin hole free and had to be coated a second time with an insulating paint composition.

There is a need then for an improved method of electrocoating polyamic acid polymers onto copper substrates which eliminates copper diffusions into the polymer acid polymer film layer, and also provides a pin hole free, uniform film in a one step coating operation.

SUMMARY OF THE INVENTION

In accordance with this invention, it has been found that the foregoing difficulties may be overcome, so that metal substrates, such as copper foil, wire and coils, can be electrocoated with good edge coverage, without pin holes, in an extremely uniform film layer, in a single coating operation, without copper diffusion into the resin film layer. This is made possible by anodically micro-smoothing and then nickel coating the copper substrate. This is followed by the single step electrodeposition of a polyamic acid polymer from a non-aqueous composition. The coating is then imidized, generally by a heat cure, to produce the corresponding polyimide film.

In the method of this invention, a copper substrate is: (1) anodically microsmoothed in an acid bath to provide a substantially smooth, level, substrate surface free of slivers, burrs, ridges and other protrusions or recessed areas. In the preferred process, this is accomplished by an electropolishing operation, wherein the substrate is made an anode (positive electrode) in an active acid solution bath and electrosmoothed at a current density of between about 100 amp./sq. ft. to about 2,000 amp./sq. ft. of the surface to be coated. An acid is used in this step which is effective, within the above described current density range, to selectively remove slivers and burrs from the copper substrate and provide a substantially smooth, level, micropolished substrate surface particularly suitable for pin hole free nickel deposition, (2) electrocoated with a uniform nickel film from a nickel containing bath, to a thickness of between about 0.10 mil (2.5 microns) to about 0.5 mil (0.0005 inch or 12.5 microns) and (3) single step electrocoated with a composition comprising a polyamic acid polymer, a nitrogen containing base which reacts with the acid to form a salt, and a dual liquid system consisting of a liquid, organic, non-aqueous solvent for the polyamic acid and a liquid, organic, non-aqueous, non-solvent for the salt of the polyamic acid.

In electrocoating the substrate with the polyamic acid composition, the substrate is made an anode in a polyamic acid bath at a current density and for a time effective to deposit a polyamic acid polymer film on the substrate; after this the coated substrate is cured to convert the polyamic acid polymer film to a polyimide film free of copper ion cotamination.

BRIEF DESCRIPTION OF THE DRAWINGS

For a better understanding of the invention reference may be made to the preferred embodiments, exemplary of the invention shown in the accompanying drawings, which is a block flow diagram showing one preferred embodiment carrying out the method of this invention.

DESCRIPTION OF THE PREFERRED EMBODIMENTS

In the method of this invention, the copper substrate to be coated can be a wire, foil resistor, a hexagonal form-wound coil, a generator stator coil or any other type of copper conductor or copper object.

As an initial, optional cleaning step, the copper substrate may be made a cathode (negative electrode), in an alkaline bath, for a time at a temperature and current density, usually about 5 sec. to 3 min. at 25° to 90° C and 150 amp./sq. ft. to 1,500 amp./sq. ft. current density, effective to clean and degrease the copper. This may be followed by a running water rinse and air drying. Useful alkaline degreasing solutions include, among others, sodium hydroxide, potassium hydroxide, and phosphate-silicate containing sodium oxides.

Less rigorous cleaning and degreasing may be provided by dipping the copper substrate in a suitable degreasing solution which effectively removes oil and organic matter. Suitable degreasing solutions would include methyl alcohol, ethyl alcohol, propyl alcohol, butyl alcohol and the like, ketones such as acetone, methyl ethyl ketone and the like, trichlorethylene, perchlorethylene and the like. A 10 sec. to 120 sec. dip will generally be effective for cleaning and may be followed by a running water rinse and air drying.

The copper substrate, preferably cleaned and degreased, is made an anode (positive electrode) in an acid bath, for a time at a temperature and current density, usually about 5 sec. to 2 min. at 25° to 75° C and between about 100 amp./sq. ft. to about 2,000 amp./sq. ft. current density, effective to selectively remove slivers and burrs from the copper substrate and provide a substantially smooth, level micropolished substrate surface. This surface is particularly suitable for pin hole free nickel deposition.

The copper surface will contain macroscopic or gross slivers and/or burrs caused by scratching or shearing of the surface after the copper workpiece is manufactured. The copper surface will also contain microscopic protrusions and indentations as ridges and valleys and pores in the surface, formed during manufacture. For effective pin hole free films of nickel and polyimide, the macroscopic and microscopic protrusions should be removed.

By "substantially smooth surface", is meant a finish where substantially all the macroscopic slivers and burrs are either removed or rounded off, and the actual surface area is substantially reduced, as measured by profilometry techniques well known to those skilled in the art, or as observed by comparative surface reflectivities.

This micropolishing step may be followed by a running water rinse, and also an additional alkaline degreasing-running water rinse step, as described hereinabove. Useful acids for micropolishing must be active and effective to complex or dissolve copper, to provide a substantially smooth surface within the above described current density range, and preferably includes, among others, phosphoric acid and sulfuric acid.

Current densitites below 100 amp./sq. ft in the anodic electropolishing step may leave the copper heavily oxidized. This oxide layer will interfere with the following nickel "strike" or "plate" and subsequent organic electrocoating. Below this value the copper surface will not be smoothed to remove slivers and burrs. A current density above 2,000 amp./sq. ft. may cause excessive heating of the bath and possible uneven rapid wear of the surface.

The microsmoothed copper surface provides an excellent base for subsequent nickel coating and allows formation of thin pin holes free nickel films. The microsmoothed copper substrate is next immersed in a 25° to 35° nickel solution bath having a pH of between about 0.5 to about 5.0. The copper workpiece is made a cathode (negative electrode) by connecting it to the negative terminal of a power supply. A D. C. potential is applied for a time at a temperature and current density effective to deposit a nickel layer having a thickness of between about 0.10 mil (2.5 microns) to about 0.5 mil (12.5 microns), with a preferred range of between about 0.10 mil to about 0.3 mil (7.5 microns). It is critical that the nickel coating is at least about 0.10 mil (2.5 microns) thick, or pin holes will invariably form which will allow scattered copper ion diffusion into the subsequently coated polyamic acid polymer film. A nickel thickness greater than 0.5 mil (12.5 microns) may cause the nickel coating to crack on bending.

Effective nickel coating times and temperatures can vary from about 25 sec. to 30 min. at 25° to 65° C. The current density range is a function of the individual nickel plating system. Effective current densities will range from about 10 amp./sq. ft. up to about 1,000 amp./sq. ft. Useful nickel plating solutions used in the nickel containing bath are nickel sulfamate, nickel sulfate and nickel chloride. Preferably, a nickel "strike", about 0.05 mil (1.25 microns) thick, will be deposited from a nickel chloride bath, followed by a nickel "plate" about 0.10 mil (2.5 microns) thick, deposited from a nickel sulfamate or nickel sulfate bath.

The nickel chloride solution will generally contain hydrochloric acid in amounts ranging from 50 ml. to 100 ml. for about 200 grams to 250 grams of nickel cloride per liter of water. A typical nickel chloride electrocoating bath would contain about 235 g/liter nickel chloride, about 86 ml./liter commercial hydrochloric acid and the balance water. This will provide a very acidic solution, having a pH of between about 0.25 to 2. It is preferred to use the above nickel chloride solution in an initial 5 sec. to 30 sec. dip step, prior to nickel electroplating. The nickel chloride solution dip will dissolve any copper phosphate or copper sulfate film remaining after the acidic electropolishing step. When current is then applied to this solution, it is also thought to reduce any remaining copper oxides to copper metal and thus "activate" the copper substrate prior to plating.

Effective current densities for the nickel chloride bath will range from about 10 amp./sq. ft. to about 1,000 amp./sq. ft., with a preferred range of between about 150 amp./sq. ft. to about 300 amp./sq. ft. In this preferred range, a uniform nickel strike film, about 0.10 mil (0.25 micron) to 0.05 mil (1.25 microns) thick, will be formed in about 25 seconds. This provides an excellent base for subsequent nickel coating with standard nickel sulfamate or nickel sulfate solutions. Of course the entire nickel film, 2.5 microns to 12.5 microns thick, can be electrocoated from nickel sulfamate or nickel sulfate solutions in a single step if desired.

A nickel plate can be applied after a running water rinse following the anodic electrosmoothing, or after the initial, optional, preferred nickel strike described above. The nickel sulfamate and nickel sulfate solutions will have a pH of between about 2 to 5. The characteristics and operating conditions of these standard nickel solution baths are well known in the plating art. For example, suitable nickel sulfamate baths could contain a buffer such as boric acid, present in amounts ranging from 10 g/liter to saturation, in addition to between 200 g/liter to 700 g/liter of nickel sulphamate. A typical nickel electrocoating bath would contain about 300 g/liter of nickel sulfamate (about 55 g/liter of nickel), about 40 g/liter of boric acid and the balance water, operated at a pH of about 4.

The bath may also contain up to about 1 g/liter of a wetting agent such as sodium lauryl sulfate or sodium lauryl sulfoacetate, which provides effective surface tension properties in the bath for superior plating. The usual impurities known to be harmful in nickel plating, such as zinc, chromium and lead, should be maintained at very low levels.

Effective current densities for the nickel sulfamate or nickel sulfate bath will range from about 10 amp./ sq. ft. to about 100 amp./sq. ft., with a preferred range of between about 15amp./sg. ft. to about 50 amp./sq. ft. In this preferred range a nickel film about 0.10 mil thick will be formed in about 8 to 2 minutes.

In the nickel electrocoating step, the anode may be a non-consumable carbon electrode or one that will replenish metal ions to the bath such as nickel. The anode can be in bar, plate, mesh or chip form. When a nickel anode is used it may contain a small proportion of sulfur, about 0.02% to 0.04%, to promote dissolution.

In a preferred embodiment of the invention, the copper substrate will be: (1) degreased or cleaned by any suitable method, preferably by cathodic alkaline degreasing; (2) rinsed; (3) anodically electroetched or electromicropolished; (4) rinsed; (5) additionally degreased or cleaned as in step (1); (6) rinsed; (7) immersed in acidic nickel chloride solution; (8) electrocoated with a nickel strike film from an acidic nickel chloride solution; (9) rinsed; (10) electrocoated with a nickel plate film from an acidic nickel sulfamate or nickel sulfate solution; (11) rinsed; (12) further electrocoated with a second nickel strike film from an acidic nickel chloride solution; (13) rinsed and (14) dried and covered to protect the nickel finish. This preferred embodiment is shown in the flow diagram of the drawing. In another embodiment of the invention, steps (5), (6), (7), (8), (9), (12) and (13) may be eliminated. In a further embodiment, steps (1) and (2) may also be eliminated in addition to the steps eliminated above.

In all cases, the nickel plated surface will remain oxide free for only a limited time period, up to about 3 weeks, after which it will become passive and interfere with the wetting of the organic solvents when electrocoating with polyamic acid polymer. When the nickel coating becomes passive, pin hole porosity in the cured polyimide film insulation will result. The nickel coated substrate can be stored in acetone, alcohol, or other suitable protective liquids or in an inert atmosphere to increase its oxide free period.

One of the preferred cured imide films, after electrodeposition of polyamic acid polymer and subsequent heating in accordance with this invention comprises polymers of aromatic polyimides having the recurring unit:

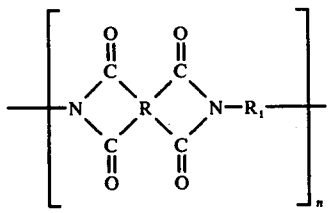

wherein n is at least 15, R is at least one tetravalent organic radical selected from the group consisting of

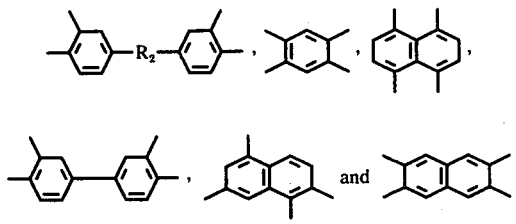

$R_2$ being selected from the group consisting of divalent aliphatic hydrocarbon radicals having from 1 to 4 carbon atoms and carbonyl, oxy, sulfo and sulfonyl radicals and in which $R_1$ is at least one divalent radical selected from the group consisting of:

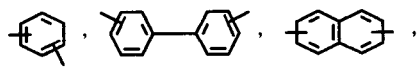

-continued

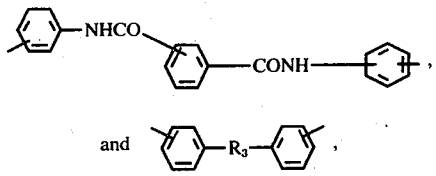

in which $R_3$ is a divalent organic radical selected from the group consisting of $R_2$, silico and amido radicals. Polymers containing multiple series of $R_1$ containing amido radicals, are particularly valuable in some instances. The aromatic polyamide-imide resins, represented by certain of the foregoing formulae are described and claimed in U.S. Pat. No. 3,179,635.

The described essentially insoluble, cured, high temperature resistant films are derived from certain resinous materials, preferably soluble aromatic polyamic acids in solvent solutions. In the present invention a resinous salt, such as a polyamic acid salt, is provided in a dual liquid system. The film, after application to a suitable copper wire, foil resistor or other type electrically conductive copper substrate by electrodeposition methods, is heated for a time sufficient to cure the precursor film to its solid resinous state.

In general, the soluble polyamic acid precursors, which are preferred materials of this invention, are prepared by admixing a suitable aromatic tetracarboxylic dianhydride with an aromatic diamine in a suitable solvent at room temperature. The admixture or solution is stirred until a maximum viscosity is reached. Examples of suitable dianhydrides are pyromellitic dianhydride, benzophenone tetracarboxylic dianhydride, naphthalene tetracarboxylic dianhydride and the like. Examples of suitable diamines are m-phenylene diamine, methylene dianiline, diaminodiphenyl ether, diaminobenzanilide and the like. References which describe the procedure in greater detail are U.S. Pat. Nos. 3,179,635; 3,179,614; 3,179,631; 3,179,632; 3,179,633 and 3,179,634. The polyamic acid precursors are well known and commercially available in solvent solutions.

The same general procedure is employed when a derivative of an aromatic tricarboxylic anhydride, e.g., trimellitic anhydride chloride or the ester diacid chloride of trimellitic anhydride is used in place of the aforesaid aromatic dianhydride. The above-named diamines are, of course, also suitable for use with the tricarboxylic anhydride derivatives.

One of the aromatic polyamic acid polymers suitable for use as a soluble precursor in this invention has the recurring unit:

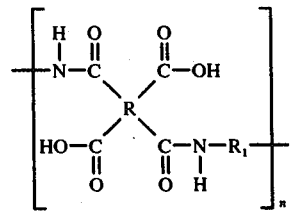

in which $n$ is at least 15 and R and $R_1$ are identical to the description hereinabove relating to the solid aromatic polyimide and polyamide-imide resins. It should be understood that suitable polyamic acids may also contain two or more of the R and/or $R_1$ radicals.

Suitable solvents for the polyamic acids are aprotic solvents, i.e., solvents which will neither lose a proton to the solute nor gain a proton from the solute, for example, the normally liquid organic solvents of the N,N-dialkylcarboxylamide class, preferably the lower molecular weight members of this clas, such as dimethyl acetamide, dimethyl formamide, and N-methyl-2-pyrrolidone. Other useful aprotic solvents include dimethyl sulfoxide and pyridine. The solvents can be used individually or in combinations of two or more. The solvents are easily removed by heating in a drying tower or oven.

In addition to the aforementioned aromatic polyimide and polyamide-imide recurring unit wherein R was a tetravalent organic radical, other cured resins which are particularly suitable as films which can be electrodeposited in accordance with this invention are derived from trivalent anhydrides and have the structure:

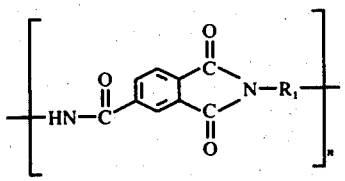

wherein $R_1$ and $n$ are identical to the description hereinabove relating to the solid aromatic polyimide and polyamide-imide resins.

Particularly valuable films are provided when $R_1$ is

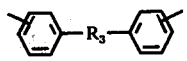

where $R_3$ is an oxy or methylene ($-CH_2-$) radical.

The soluble polyamic acid precursors for the above trivalent derived polyamide-imide resins include in repeating form one or both of the structures:

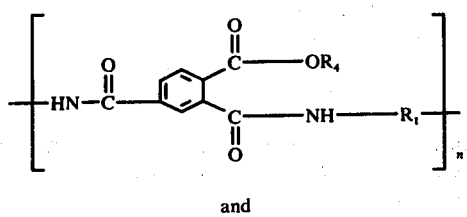

and

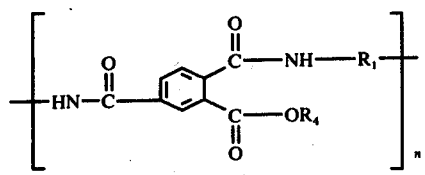

wherein $R_1$ and $n$ are identical to the description hereinabove and $R_4$ is selected from the group consisting of —H, alkyl or aryl radicals. For details on the preparation of these soluble polyamic acids and the solid resins therefrom, reference may be had to British Pat. Nos. 1,056,564 and 1,032,649. The same solvents as previously described can be used for the above aromatic polyamic acids. Copolymers of the tetravalent and trivalent anhydride compounds may also be employed in polyamic acid form. Groups other than amic acid may also be included on the polymer chain so long as the salt in solution or the dispersion formed therefrom is electrically conductive and has mobility sufficient to deposit on the nickel coated copper substrate.

In the method of this invention, the preferred polyamic acids have been successfully electrodeposited from colloidal dispersions and from solutions of amine salts of the same polyamic acids in a mixed system of two miscible organic liquids. The preferred colloidal composition consists of a colloidal dispersion of the amine salt of the polyimide precursor within a critically balanced liquid solvent-non-solvent organic mixture and has a pH range between 8–10. This dispersion is electrically conducting.

Although the colloidal composition is preferred for coating resistor ribbons because of a very heavy edge coverage, where a more uniform coverage is required on a copper object, a non-colloidal solution can be used in the electrodeposition bath. The non-colloidal solution consists of the amine salt of the polyimide precursor in solution within a critically balanced liquid solvent-non-solvent organic mixture and has a pH range between 8–10. This solution is electrically conducting and preferably has a maximum solids concentration so that it is essentially saturated.

The non-aqueous medium in which the acid salt is dispersed in either composition consists of a non-electrolizable liquid which is not capable of dissolving the acid salt of the polymer chain. This non-solvent for the acid salt polymer must not gas to any great extent at the electrodes due to electrolysis when a voltage is applied to the system. Preferred liquids are non-electrolizable liquids which are a non-solvent for the acid salt of the polymer and would include liquid aliphatic (straight and branched chain) and aromatic ketones, such as, for example, acetone, methyl isobutyl ketone, methylethylketone, methyl n-propylketone, diethylketone, mesityloxide, cyclohexanone, methyl n-butyl ketone, ethyl n-butyl ketone, methyl n-amyl ketone, acetophenone, methyl n-hexylketone, isophorone and di-isobutylketone.

The basic organic nitrogen containing compounds which react with the acid polymer to form a stable acid salt are preferably organic bases and include nitrogen containing tertiary aliphatic and aromatic amines such as, for example trimethylamine, triethylamine, N N-dimethylbenzylamine, tri-n-propylamine, tri-n-butylamine, N-ethylpiperidine, N-allylpiperidine, N-ethylmorpholine, N,N-diethyl-m-toluidine, N,N-diethyl-p-toluidine, N-allylmorpholine, N,N-diethylaniline, pyridine, imidazole, 1-methylimidazole, 4-methylimidazole, 5-methylimidazole, 1-propylimidazole, 1,2-dimethylimidazole, 1-ethyl-2-methylimidazole and 1-phenyl-imidazole.

In preparing the conducting polyamic acid salt electrodeposition composition the component materials must be added within critical wt. ratios. The process for preparing the colloidal dispersion consists of: (1) reacting a polyamic acid polymer in a non-aqueous organic solvent solution, which is preferably non-electrolizable, with a nitrogen containing base selected from the group consisting of amines, including imidazoles, to form an acid salt, (2) adding the salt solution to a non-aqueous, organic non-solvent for the polyamic acid salt which is substantially non-electrolizable to provide te colloidal dispersion of the salt within the solvent mixture. The colloidal electro-deposition composition is formed by addition of about 1 part by weight polyamic acid polymer, about 29 to 40 parts solvent for said acid, about 0.5 to 3.0 parts nitrogen containing base, or an amount effective to convert all the carboxyl groups into the salt, and about 50 to 150 parts non-solvent for the salt of the acid.

The process for preparing the non-colloidal pure solution consists of: (1) reacting a polyamic acid polymer in a non-aqueous, organic, solvent solution, which is preferably non-electrolizable, with a nitrogen containing base selected from the group consisting of amines, including imidazoles, to form an acid salt, (2) adding a non-aqueous, organic, non-solvent for the polyamic acid salt which is substantially non-electrolizable, dropwise to the salt solution, so as to just keep the salt in solution and prevent its precipitation. The non-colloidal electrodeposition composition is formed by addition of about 1 part by weight polyamic acid polymer, about 12.5 to 15.5 parts solvent for said acid, about 0.5 to 3.0 parts nitrogen containing base, or an amount effective to convert all the carboxyl groups into the salt, and about 7 to 9 parts non-solvent for the salt of the acid. In both cases, the acid salt may be separately formed and then added to the solvent or the solvent-non-solvent mixture.

Substitution of any compounds which are electrolizable, such as ammonium hydroxide type base, water, methanol, ethanol and aqueous sodium or potassium hydroxide for the solvents or bases described above, will cause pitting in the final electrodeposited film. It is to be understood, however, that the term "non-aqeuous" means substantially water free and can include trace amounts of water that might be picked up by the ingredients from the atmosphere. Small effective amounts of filler particles, as such, or as finely divided pigments or solid lubricants can be added to these compositions for a variety of end uses such as color coating, or thin antifriction films.

In electrocoating with polyamic acid polymer, the preferred films are provided at bath temperatures of between about 25° to 35° C, current densities of between about 2 m.A/sq. in. to 15 m.A/sq. in. of the surface to be coated, potential differences between about 10 volts to 250 volts and dwell times of between about ½ to 35 minutes, in a continuous or batch type single coat operation. Curing conditions in hot air ovens will include top temperatures of from about 275° to 350° C for about ½ to 4 hours. After curing, the polyimide film will be substantially free of copper ions deposits, i.e., the insulation will contain less than about 0.1 wt. % copper content based on emission spectra analysis.

EXAMPLE 1

Copper hairpin generator stator coils containing burrs and slivers from scratches were nickel strike and plate electrocoated, and then single step electrocoated with a polyamic acid solution and cured. The coils were: (1) made cathodes in a 200 liter alkaline bath, and cathodically degreased for 30 sec. at 82° C and about 400 amp./sq. ft. The degreasing alkaline bath comprised phosphate and silicate in a base of $Na_2O$ powder, at a concentration of about 60 grams per liter of water (sold commercially under the Tradename B.

N. Electrocleaner by Wyandotte Chem. Co.). (2) The copper coils were then placed in a 150 liter overflow type, running water rinse bath. (3) The copper coils were then made anodes in a 200 liter acid bath, and anodically electroetched and electromicropolished for 15 sec. at 25° C and about 800 amp./sq. ft. at approximately 35 volts. The cathode was a set of four lead bars. The acid bath comprised 50% by volume of commercial phosphoric acid, with 50% by volume water. (4) The copper coils were then placed in an overflow type, running water rinse bath.

The coils were examined and their copper surface was found to be microsmooth and substantially free of slivers and burrs. (5) Step (1) was then repeated for 10 sec. to remove any copper salt films present on the copper coils. In many applications it is felt that the degreasing steps may not be necessary, as suitable cleaning would be provided by the step (3) anodic electroetching and electropolishing. The degreasing steps, however, do provide optimum preparation for nickel coating. (6) The coils were then washed as in step (2).

The electrocleaned and electrosmoothed copper coils were then (7) immersed at 25° C for 10 sec. in a 200 liter nickel chloride bath having a pH of about 0.25 to 0.50. This helped dissolve any remaining copper salt films. The nickel chloride bath contained about 238 grams/liter nickel chloride, and about 86 ml./liter commercial hydrochloric acid with the balance water. (8) The coils, still immersed in the 25° C nickel chloride bath, were made cathodes by connection to the negative terminal of a power supply and a D.C. potential was applied for 25 sec. at 250 amp./sq. ft. at approximately 10 volts. The anode was a 95 wt. % pure nickel bar containing a small amount of sulfur.

This produced a uniform, nickel strike film about 0.05 mil (1.25 microns) thick on the copper surface. (9) The nickel strike coated copper coils were then placed in an overflow type, running water rinse bath. (10) The nickel strike coated coils were immersed in a 380 liter nickel sulfamate bath having a pH of about 4, and made cathodes. A D.C. potential was applied for 12 min. at about 20 amp./sq. ft. The anode was a 95 wt. % pure nickel bar containing a small amount of sulfur. The nickel sulfamate bath contained about 300 grams/liter of nickel sulfamate, about 40 grams/liter of boric acid with the balance water.

This produced a uniform, pin hole free nickel plate film about 0.2 mil (5 microns) thick coated over the nickel strike surface of the coils. (11) The copper coils were then placed in an overflow type, running water rinse bath. (12) The copper coils were then again immersed in the nickel chloride bath at 25° C and step (8) repeated for 10 sec. at 250 amp./sq. ft. This produced an additional nickel strike of about 0.02 mil (0.5 micron) on the nickel plate. (13) The triple nickel coated copper coils were then placed in an overflow type, running water rinse bath and (14) dried with paper towels and wrapped to prevent contamination of the nickel surface.

The nickel coating thickness totaled about 0.27 mil (6.75 microns) on the coils. The coating was uniform, continuous, smooth, strongly adherent to the copper substrate base and pin hole free. This method provides the optimum protective nickel coating with the best guarantee against copper ion diffusion. However, excellent results can be attained by: anodic electroetching and electropolishing in either phosphoric or sulfuric acid, as in step (3); washing, as in step (4); and one step nickel plate electrocoating from a nickel sulfamate or nickel sulfate bath, as in step (10), so long as the nickel plate is at least about 0.10 mil thick.

A colloidal polyamic acid electrodeposition emulsion was then formed by: (1) mixing 17.5 grams of polyamic acid polymer dissolved in 88.5 grams of N-methyl-2-pyrrolidone solvent for the polymer (100 ml. of a polyimide wire enamel solution having 16.5 wt. % solids content and sold commercially by Du Pont under the tradename Pyre M.L. RC 5057 Polyimide Wire enamel) with 547 grams (500 ml.) of dimethylsulfoxide solvent for the polymer and then, adding 20.8 grams (20 ml.) of 1-methyl imidazole dropwise to produce the amine salt of the polyamic acid. The resulting solution containing 1.2 parts by weight organic amine (imidazole) and 36.3 parts by weight combined solvent for the polymer to 1 part acid polymer; (2) this solution was added with vigorous stirring to 1610 grams (2,000 ml.) of methyl ethyl ketone, a non-solvent for the acid salt, to provide a composition containing 92 parts by weight non-solvent for the acid salt to 1 part acid polymer.

About 5.76 liters of this electrodeposition composition, having a pH of about 8–9, was added to a cylindrical 6 inch dia. x 14 inch high cell fabricated from polyethylene. Two rectangular stainless steel electrodes were clamped inside the cell with about a 3 inch gap between them. The nickel strike and plate coated coils were clamped between the electrodes, so that there was about a 1 to 1½ gap between the coil surface and each of the electrode surfaces. The time interval between nickel coating and insulating was only about 1 hour, so that the nickel surface was not oxidized. The polyamic acid electrodeposition temperature was about 25° C.

A potential difference of 25 volts from a D.C. power supply was applied across the electrodes for 8 min. During this time an adherent coating on the coils (anodes) was produced, without any gasing of the composition, in a single step operation. Current densities were about 2 to 3 m.A/sq. in. of electrode surface.

The coated coils were then removed from the colloidal polyamic acid electrodeposition composition and slowly heated for ½ hour at 100°, 150°, 200°, 250° and 300° C, respectively. A very tough, non-porous, continuous, pin hole free, flexible film coating with excellent adhesion and good edge coverage, about 1 to 2 mils thick (0.001 to 0.002 inch) was produced. The coating did not show any evidence of green coloration, indicating that there was no diffusion of copper ions into the resin layer, or at least less than about 0.1 wt. %. Increased electrolysis times, during the same single step operation, would produce thicker coatings. For short electrolysis times, less than 30 minutes, there was no necessity to stir the composition, and no precipitation or agglomeration of the resin was seen. Similar results would be produced for other copper substrates, such as foils and copper wire.

The coils were then thermally aged at 300° C for 312 hours. After this time the coating still had good adhesion and flexibility. The coils were removed at various time intervals and subjected to an electrical strength test, involving placing a polyimide-nickel coated coil in No. 7½ lead shot and then applying a potential difference of 2,000 volts across the coil insulation for 1 minute. The coils showed excellent thermal aging characteristics up to 168 hours, did not short even after 312 hours, and while they began to fail after 168 hours, some withstood 2,000 volts for 1 minute after 192 hours of aging. The results are shown after Example 2 below in Table 1.

The physical properties of the coils were then evaluated. Tests were run for enamel properties at 15% elongation (stretch 15% and flat bend 180° around a 0.090 dia. mandrel) and ½ hour heat shock at 400° C. The coils showed excellent physical properties and passed the elongation and heat shock test without any loss of enamel adhesion or flexibility, even after 312 hours. These results are shown after Example 2 below in Table 2.

EXAMPLE 2

As a comparative example, two additional sets of copper hairpin generator stator coils were single step electrocoated with a polyamic acid solution and cured. Sample set 2(a) was not nickel coated. It was only cleaned with acetone before electrocoatng with polyamic acid solution. Sample set 2(b) was given a nickel strike as in Example (1) before electrocoating with polyamic acid solution: i.e., using the same process conditions, steps (1) through (8) were followed, i.e., cathodic alkaline degreasing, electropolishing, cathodic alkaline degreasing, nickel chloride immersion, and cathodic strike coating with washing between the steps; this produced a uniform, nickel strike film about 0.05 mil (1.25 microns) thick on the copper surface. After washing, Sample set 2(b) was dried with paper towels and wrapped to prevent contamination.

A collodial polyamic acid electrodeposition emulsion was formed as in Example 1 using the same ingredients, amounts and procedure. Sample sets 2(a) and 2(b) were clamped between stainless steel electrodes as in Example 1, using a cylindrical polyethylene cell containing 5.76 liters of the electrodeposition composition, and a potential difference of 25 volts from a D.C. power supply was applied for 8 min., as in Example 1. During this time an adherent coating on the coil (anode) was produced in a single step operation. The time interval between nickel strike coating Sample set 2(b) and insulating was only about 1 hour, so that the nickel surface was not oxidized.

The coated coils were removed from the colloidal polyamic acid electrodeposition composition and slowly heated in a convection oven for ½ hour at 100°, 150°, 200°, 250° and 300° respectively. A very tough film coating wit good edge coverage about one to two mils thick was produced on both coil sets. Sample sets 2(a) appeared to be porous and showed definite signs of green coloration, which indicated substantial copper ion inclusion in the polyimide coating. Sample set 2(b), with the 0.05 mil nickel strike, appeared to be non-porous, and showed spotty signs of green coloration, indicating some copper ion inclusion in the polyimide coating.

These coils were then thermally aged at 300° C for 312 hours as in Example 1. The coil Sample sets 2(a) and 2(b) were removed at varying time intervals and subjected to the electric strength test described in Example 1. Samples of set 2(a) did not pass the electrical strength test after 24 hours thermal aging and showed a dead short after 48 hours. Samples of set 2(b) showed improved thermal aging characteristics up to 48 hours, but did not pass the electrical strength test after 120 hours, and showed a dead short after 288 hours. The results are shown below in Table 1.

Physical properties of coil Sample sets 2(a) and 2(b) were then evaluated at 15% elongation and 400° C heat shock as in Example 1. Samples of set 2(a), electrocoated over bare copper bared very poorly, since the electrocoating step causes copper ion diffusion and there was no nickel to protect the enamel. Samples of set 2(b) showed improved performance, lasting 24 hours before the enamel lost adhesion and flexibility in the elongation test, and up to about 192 hours before failure in the heat shock test. The data from Examples 1 and 2 are tabulated below:

These results clearly show that the combination of micropolishing and nickel undercoating beneath the polyimide insulation provides vastly improved electrical strength, adhesion, and heat shock properties after thermal aging. The results also show that a 0.2 mil nickel plate coating provides improved electrical strength, and much improved insulation adhesion and heat shock properties, over those of 0.05 mil nickel strike coatings under the insulation.

TABLE 1

EFFECT OF THERMAL AGING IN AIR AT 300° C ON
ELECTRICAL PROPERTIES OF POLYIMIDE COATED COILS

| Coating | Initial Electrical Strength | Aging Hrs. −300° C | Final Electrical Strength |
|---|---|---|---|
| Cleaned, | Passed 1 min. 2000 V | 0 | Breakdown 45 sec. 2000 V |
| Electro- | Passed 1 min. 2000 V | 24 | Passed 1 min. 2000V |
| polished, | Passed 1 min. 2000 V | 48 | Passed 1 min. 2000 V |
| Nickel | Passed 1 min. 2000 V | 120 | Passed 1 min. 2000 V |
| "struck", | Passed 1 min. 2000 V | 144 | Passed 1 min. 2000 V |
| Nickel | Passed 1 min. 2000 V | 168 | Breakdown 400 V |
| "plated", | Passed 1 min. 2000 V | 192 | Passed 1 min. 2000 V |
| Electrocoated, | Breakdown 1100 V | 216 | Breakdown 850 V |
| Example 1 | Breakdown 1300 V | 288 | Breakdown 1100 V |
| (0.27 mil, | Breakdown 1900 V | 312 | Breakdown 600 V |
| 6.75 micron nickel coating) | | | |
| | Passed 1 min. 2000 V | 0 | Passed 1 min. 2000 V |
| Cleaned, | Breakdown 5 sec. 2000 V | 24 | Breakdown 250 V |
| Electrocoated, | Breakdown 1000 V | 48 | Dead Short |
| Sample set2(a) | Passed 1 min. 2000 V | 120 | Dead Short |
| (no nickel | Passed 1 min. 2000 V | 144 | Dead Short |
| coating) | Passed 1 min. 2000 V | 168 | Dead Short |
| | Passed 1 min. 2000 V | 192 | Dead Short |
| | Passed 1 min. 2000 V | 216 | Dead Short |
| | Breakdown 2000 V | 288 | Dead Short |
| | Breakdown 1350 V | 312 | Dead Short |
| Cleaned | Passed 1 min. 2000 V | 0 | Passed 1 min. 2000 V |
| Electro- | Passed 1 min. 2000 V | 24 | Passed 1 min. 2000 V |
| polished, | Passed 1 min. 2000 V | 48 | Passed 1 min. 2000 V |
| Nickel | Passed 1 min. 2000 V | 120 | Breakdown 1400 V |
| "struck", | Passed 1 min. 2000 V | 144 | Breakdown 950 V |
| Electrocoated, | Passed 1 min. 2000 V | 168 | Breakdown 1050 V |
| Sample set2(b) | Passed 1 min. 2000 V | 192 | Breakdown 1200 V |
| (0.05 mil, | Passed 1 min. 2000 V | 216 | Breakdown 950 V |
| 1.25 micron | | | |
| nickel | Breakdown 400 V | 288 | Dead Short |
| coating | Passed 1 min. 200 V | 312 | Dead Short |

TABLE 2

PHYSICAL PROPERTIES OF POLYIMIDE COATED COILS

| Coating | Aging Hrs.−300°C | Enamel Behavior at 15% Elongation | Heat Shock Test 400°C |
|---|---|---|---|
| Cleaned, | 0 | Passed | Passed |
| Electro- | 24 | Passed | Passed |
| polished, | 48 | Passed | Passed |
| Nickel | 120 | Passed | Passed |
| "Struck", | 144 | Passed | Passed |
| Nickel | 168 | Passed | Passed |
| "plated", | 192 | Passed | Passed |
| Electrocoated, | 216 | Passed | Passed |
| Example 1 | 288 | Passed | Passed |
| (0.27 mil, 6.75 micron nickel coating) | 312 | Passed | Passed |
| Cleaned, | 0 | Passed | Passed |
| Electrocoated, | 24 | Enamel Lost Adhesion | Failed |
| Sample set 2(a) (no nickel coating | | | |
| Cleaned, | 0 | Passed | Passed |
| Electro- | 24 | Passed | Passed |
| polished, | 48 | Passed | Passed |
| Nickel | 120 | Enamel Lost Adhesion | Passed |
| "struck", | 144 | Enamel Failed | Passed |
| Electrocoated, | 168 | Enamel Failed | Passed |
| Sample set 2(b) | 312 | Enamel Failed | Passed |
| (0.05 mil,) 1.25 micron nickel coating) | | | |

We claim:

1. A method of coating a copper substrate comprising the steps of:
    A. anodically microsmoothing the copper substrate surface by making the substrate surface a positive electrode in an acid bath at a current density of between 100 amp./sq. ft. to 2,000 amp./sq. ft., said acid being effectively active within the current density range to dissolve copper and to provide a substantially smooth copper surface,
    B. electrocoating the microsmoothed substrate with a pin hole free nickel film having a thickness of between about 2.5 microns to about 12.5 microns, said film being effective to prevent copper ion diffusion,
    C. single step, non-aqueous electrocoating the microsmoothed, nickel coated substrate with a pin hole free polyamic acid polymer film, and
    D. curing the polyamic acid coating to form a polyimide film free of copper ion deposits.

2. The method of claim 1 wherein the copper substrate is placed in a nickel containing bath of nickel chloride between steps (A) and (B), made a cathode, and current applied, said current being effective to reduce any oxides present to copper metal and to electrocoat the substrate with a nickel strike film, and the copper substrate is rinsed water between step (B) and step (C).

3. The method of claim 2, wherein the nickel film is electrocoated in step (B) from a nickel containing bath selected from the group consisting of nickel sulfamate solution and nickel sulfate solution.

4. The method of claim 3 wherein the nickel strike film electrocoated between step (A) and step (B) from a nickel containing bath of nickel chloride is between about 0.25 micron to about 1.25 microns thick, and the copper substrate is a wound coil.

5. The method of claim 4 wherein the current density in the nickel electrocoating steps is between about 10 amp./sq. ft. to about 100 amp./sq. ft. and the polyamic acid polymer is electrocoated from a colloidal composition.

6. The method of clam 2 wherein the polyamic acid polymer is electrocoated from a composition comprising a polyamic acid polymer, a nitrogen containing base which reacts with the acid to form a salt, and a dual liquid system consisting of a liquid, organic, non-aqueous solvent for the acid and a liquid, non-aqueous, non-solvent for the salt of the acid.

7. The method of claim 2 wherein the acid in Step (A) is selected from the group consisting of phosphoric acid and sulfuric acid and the copper substrate is rinsed between step (A) and step (B).

8. The method of claim 1 wherein the copper substrate is cleaned and degreased at least once before step (B).

9. A method of coating the surface of a copper substrate comprising the steps of:
   A. cleaning the substrate in a degreasing solution and rinsing with water,
   B. microsmoothing the copper substrate surface by making the surface a positive electrode in an acid bath selected from the group consisting of phosphoric acid and sulfuric acid, said bath having a pH of from about 0.25 to 2.0, at a current density of between 100 amp./sq. ft. to 2,000 amp./sq. ft. to dissolve copper and to provide a substantially smooth copper surface, and rinsing with water,
   C. placing the copper substrate in a nickel containing bath of nickel chloride, making the substrate a cathode, and applying current effective to reduce any oxides present to copper metal and to electrocoat the substrate with a nickel strike film,
   D. placing the nickel strike coated copper substrate in a nickel containing bath selected from the group consisting of nickel sulfamate solution and nickel sulfate solution, making the substrate a cathode, and electrocoating the substrate with a pin hole free nickel film having a thickness of between about 2.5 microns to about 12.5 microns, said film being effective to prevent copper ion diffusion,
   E. single step, non-aqueous electrocoating the microsmoothed, nickel coated substrate with a pin hole free polyamic acid polymer film from a composition comprising a polyamic acid polymer, a nitrogen containing base which reacts with the acid to form a salt, and a dual liquid system consisting of a liquid, organic, non-aqueous solvent for the acid and a liquid, non-aqueous, non-solvent for the salt of the acid, and
   F. curing the polyamic acid coating to form a polyimide film free of copper ion deposits.

10. The method of claim 9 wherein the nickel film is electrocoated at a current density of between about 10 amp./sq. ft. to about 1,000 amp./sq. ft. in step (C) and at a current density of between about 10 amp./sq. ft. to about 100 amp./sq. ft. in step (D).

11. The method of claim 9 wherein the copper substrate is a wound coil.

12. The method of claim 9 wherein the copper substrate is a wire.

13. The method of claim 9 wherein the copper substrate is a foil.

14. A wound copper coil coated by the method of claim 9.

* * * * *